United States Patent [19]

Hanibuchi et al.

[11] Patent Number: 5,574,391
[45] Date of Patent: Nov. 12, 1996

[54] ECL INTEGRATED CIRCUIT ALLOWING FAST OPERATION

[75] Inventors: Toshiaki Hanibuchi; Yasushi Hayakawa; Masahiro Ueda, all of Hyogo, Japan

[73] Assignee: Mitsubishi Denki Kabushiki Kaisha, Tokyo, Japan

[21] Appl. No.: 453,120

[22] Filed: May 30, 1995

[30] Foreign Application Priority Data

Jun. 2, 1994 [JP] Japan .................................. 6-121096

[51] Int. Cl.$^6$ .............................................. H03K 19/086
[52] U.S. Cl. .............................................. 326/126; 326/18
[58] Field of Search ................................ 326/126–127, 326/18

[56] References Cited

U.S. PATENT DOCUMENTS

| | | | |
|---|---|---|---|
| 5,059,827 | 10/1991 | Phan et al. | 326/126 |
| 5,073,728 | 12/1991 | Ovens | 326/126 |
| 5,089,724 | 2/1992 | Chuang et al. | 326/126 X |
| 5,124,581 | 6/1992 | Umeki | 326/126 X |
| 5,146,116 | 9/1992 | Sugimoto | 326/126 |
| 5,177,379 | 1/1993 | Matsumoto | 326/126 |
| 5,237,216 | 8/1993 | Hayano et al. | 326/126 |
| 5,298,802 | 3/1994 | Usami et al. | 326/126 |
| 5,321,321 | 6/1994 | Kuriu | 326/126 |

OTHER PUBLICATIONS

"A 23–PS/2.1–MW ECL Gate with an AC–Coupled Active Pull–Down Emitter–Follower Stage", Kai–Yap TOH et al, IEEE J. Solid–State Circuits, vol. 24, No. 5, Oct. 1989.

*Primary Examiner*—David R. Hudspeth
*Attorney, Agent, or Firm*—Lowe, Price, LeBlanc & Becker

[57] ABSTRACT

In an ECL circuit, when a potential of an input signal A changes from "L" to "H", an output signal D correspondingly changes from "H" to "L", and, at this time, an output sent from a switching stage circuit is supplied to a gate of a PMOS transistor via a control capacitor. Thereby, a base current of a pull-down transistor flows, and change of a potential of an output terminal node is promoted. An NMOS transistor receiving the potential of the output terminal node is arranged between a node and a VEE supply terminal. Therefore, when the potential changes, the current flowing through a transistor decreases, and the base current of the pull-down transistor further increases, so that the change of the output signal D is further promoted.

15 Claims, 9 Drawing Sheets

ECL INTEGRATED CIRCUIT ALLOWING FAST OPERATION

BACKGROUND OF THE INVENTION

1. Field of the Invention

The present invention relates to a semiconductor device, and in particular to a semiconductor integrated circuit which achieves a circuit structure allowing fast operation of an ECL (Emitter Controller Logic) integrated circuit without increasing a current consumption.

2. Description of the Background Art

FIG. 12 is a circuit diagram showing a concept of an ECL active-pull-down circuit disclosed in "A 23-ps/2.1-mWECL gate with an ac-coupled active-pull-down emitter-follower stage" in *IEEE J. Solid-State Circuits*, Vol. SC-24, No. 5, October 1989, pp. 1301–1306. Referring to FIG. 12, an ECL active-pull-down circuit includes a switching stage circuit 31 which is connected to a VCC supply terminal 1 and a VEE supply terminal 2, receives an input signal A and a reference potential VBB and outputs a first signal B and a second signal C, i.e., a complementary signal of first signal B, an emitter-follower transistor 60 which receives first signal B on its base and is arranged between VCC supply terminal 1 and output node 20, a bias circuit 32 which receives second signal C via a control capacitor 72 and is connected to VCC supply terminal 1 and VEE supply terminal 2, and a pull-down transistor 61 which receives on its base an output signal from bias circuit 32, has a collector connected to an output terminal node 20 and has an emitter connected to VEE supply terminal 2. Switching stage circuit 31 includes an npn bipolar transistor 50 which receives input signal A on its base via an input terminal 3, and has a collector connected to a node 15 and an emitter connected to a node 56, a bipolar transistor 51 which receives VBB potential, i.e., reference potential having an intermediate potential of a logical amplitude via a VBB terminal 4, and has a collector connected to a node 16 and an emitter connected to a node 56, and an npn bipolar transistor 52 which receives on its base a VCS potential via a VCS terminal 5, and has a collector connected to a node 56 and an emitter connected to second power supply 2 via an emitter resistance. Resistances 53 and 54 for generating predetermined potentials are arranged between VCC supply terminal 1 and nodes 15 and 16, respectively. npn transistor 52 and resistance 55 serve as a constant current supply for switching stage circuit Bias circuit 32 includes a resistance 74 connected between VCC supply terminal 1 and a node 13, diode 75 and a resistance 73 connected between node 13 and VEE supply terminal 2. Second control signal C is supplied to node 13 via control capacitor 72. First signal B, i.e., an output of switching stage circuit 31 is supplied to the base of emitter-follower transistor 60, and an output signal D is taken out from its emitter via an output node 20.

Referring to FIG. 13, operation of the ECL active-pull-down circuit shown in FIG. 12 will be described below. When input signal A sent to input terminal 3 is "L" (−1.6 V), node 15 is "H" (0 V) and emitter-follower transistor 60 is turned on, so that output signal D, i.e., the potential of output terminal 20 is "H" (−0.8 V). In this state, the potential of reference potential VBB is −1.2 V, the potential of VCC is 0 V and the potential of VEE is −5.2 V.

Pull-down transistor 61 is supplied on its base with an intended potential determined by bias circuit 32, and flows an intended emitter current of an npn bipolar transistor.

When input signal A changes to "H" (−0.8 V), first signal B changes to "L" (1.6 V), and output signal D starts to change to "L" (−1.6 V) (see A and B in FIG. 13). At this time, second control signal C sent from switching stage circuit 31 serves to increase the potential of node 13 via the coupling with control capacitor 72. This results in increase of the current which pulls down a collector current 61cI of pull-down transistor 61, i.e., output signal D, and thus output signal D can be raised rapidly. When a certain time elapses, the potential of node 13 is restored to an initial value and thus keeps the potential of output signal D at the potential of "L", so that a stationary emitter-follower current is suppressed.

Conversely, when input signal A changes from "H" (−0.8 V) to "L" (−1.6 V), the potential of node 13 is kept at a low potential for a short time, so that a current flowing from output terminal node 20 to VEE supply terminal decreases, and thus output signal D can be raised rapidly.

FIG. 14 shows a structure of the conventional ECL active-pull-down circuit in which outputs are produced in a differential manner. Referring to FIG. 14, this structure requires bias circuits 32a and 32b as well as control capacitors 72a and 72b for differential output signals D1 and D2, respectively.

The conventional ECL active-pull-down circuit has the structure described above. In this structure, bias circuit 32 for driving pull-down transistor 61 must flow a stationary current. Moreover, if there are provided a plurality of output terminals, bias circuits 32 equal in number to the terminals are required as described with reference to FIG. 14. Therefore, it has been desired to reduce or eliminate the bias current from the viewpoint of low power consumption. As the capacitance of control capacitor 72 increases, the drive effect of pull-down transistor 61 increases. Therefore, it is desired to use the control capacitor of a relatively large capacitance of several microfarads. The control capacitor of the large capacitance increases a layout occupied area. Further, if the outputs are produced in a differential manner, the control capacitor must be provided for each output, which also increases the layout occupied area.

SUMMARY OF THE INVENTION

An object of the invention is to provide a semiconductor device such as an ECL circuit, in which wasteful consumption of a bias current is prevented.

Another object of the invention to provide a semiconductor device such as an ECL circuit, in which a switching delay time is reduced with a reduced layout occupied area.

Still another object of the invention is to provide a semiconductor device such as an ECL circuit, in which change of an input signal can be rapidly reflected on an output signal.

The above objects are achieved by a semiconductor device including the following components. A semiconductor device according to the invention includes a first bipolar transistor having first and second electrodes connected to first and second potentials, respectively, and a control electrode receiving an input signal, and a second bipolar transistor having first and second electrodes connected to the first and second potentials, respectively, and a control electrode receiving a reference signal.

The semiconductor device further includes an emitter-follower transistor having a control electrode connected to the first electrode of the first bipolar transistor, a first electrode connected to the first potential and a second electrode connected to an output terminal node, and a pull-down transistor having a first electrode connected to an output terminal node and a second electrode connected to the second potential, and being responsive to change of a potential of the output terminal node. An adjusting circuit for adjusting a current of a control electrode of the pull-down transistor in response to the potential change of the output terminal node is arranged between the pull-down transistor and the second potential.

According to the semiconductor device of the invention, when the potential of the control electrode of the emitter-follower transistor changes, the output potential changes in response to the same, but, at the same time, the adjusting circuit adjusts the current of the control electrode of the pull-down transistor connected to the output potential in accordance with the potential of the output terminal node such that change of the output voltage is promoted. Therefore, the current of the control electrode of the pull-down transistor is adjusted in accordance with the value of the output voltage, so that it is not necessary to provide a circuit for flowing a bias current which is required in the prior art. As a result, the invention can provide the ECL circuit which can suppress consumption of the bias current.

Preferably, the ECL circuit further includes a biasing circuit which is connected between the output terminal node and the control electrode of the pull-down transistor, and biases the current of the control electrode of the pull-down transistor to an intended state in response to a potential at the same side as the input signal with respect to the potential of the control electrode of the emitter-follower transistor.

Since the current of the control electrode of the pull-down transistor is controlled to bias the potential of the output terminal to the desired value in accordance with the potential at the position upstream to the emitter-follower transistor, i.e., the potential at the same side as the input signal with respect to the emitter-follower transistor, the potential of the output terminal can be set to the desired value more rapidly.

According to another aspect of the invention, an ECL includes a first bipolar transistor having first and second electrodes connected to first and second potentials, respectively, and receiving on its control signal an input signal, a second bipolar transistor having first and second electrodes connected to the first and second potentials, respectively, and receiving on its control electrode a reference potential, a capacity circuit for taking out a potential from one of the first electrodes of the first and second bipolar transistors, a third bipolar transistor having a control electrode connected to the first electrode of the first bipolar transistor, a first electrode connected to the first potential and a second electrode connected to a first output terminal node, a fourth bipolar transistor connected between the first output terminal node and the second potential for accelerating the change of the potential of the first output terminal node in a first direction, a first adjusting circuit connected between the first output terminal node and the control electrode of the fourth bipolar transistor for adjusting a degree of acceleration in the first direction of the fourth bipolar transistor in response to the potential of the capacity circuit, a fifth bipolar transistor having a control electrode connected to the first electrode of the second bipolar transistor, a first electrode connected to the first potential and a second electrode connected to the second output terminal, a sixth bipolar transistor connected between the second output terminal node and the second potential for accelerating the change of the potential of the second output terminal node in a second direction different from the first direction, and a second adjusting circuit connected between the second output terminal node and the control electrode of the sixth bipolar transistor for adjusting a degree of acceleration in the second direction of the sixth bipolar transistor in response to the potential of the capacity circuit.

According to the above aspect, the potential of the first electrode of the first or second bipolar transistor is taken out with the capacity circuit, and the potential change of the first and second outputs forming the operation outputs is promoted in response to the taken-out potential. Therefore, differential outputs can be obtained without requiring multiple capacity circuits in contrast to the prior art. As a result, in the semiconductor device such as an ECL circuit, the switching delay time can be shortened with a reduced layout occupied area.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (1) First Embodiment

Figure 1:
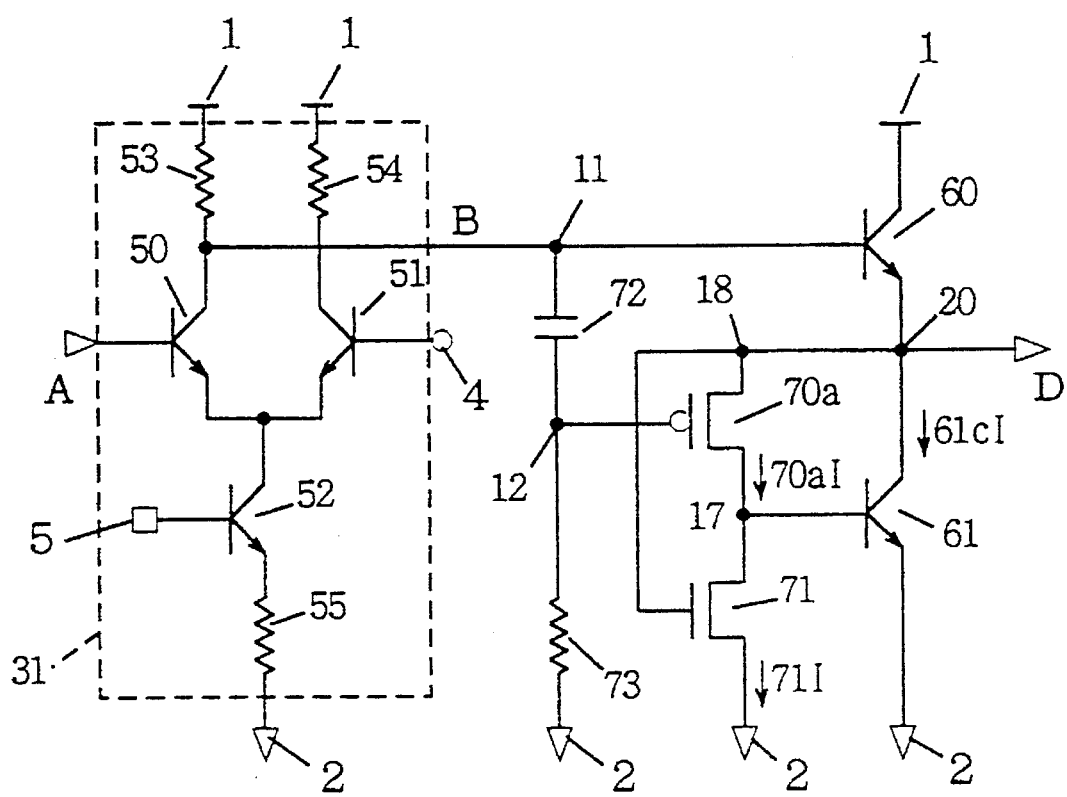
FIG. 1 is a circuit diagram of an ECL circuit according to a first embodiment of the invention.
Figure 12:
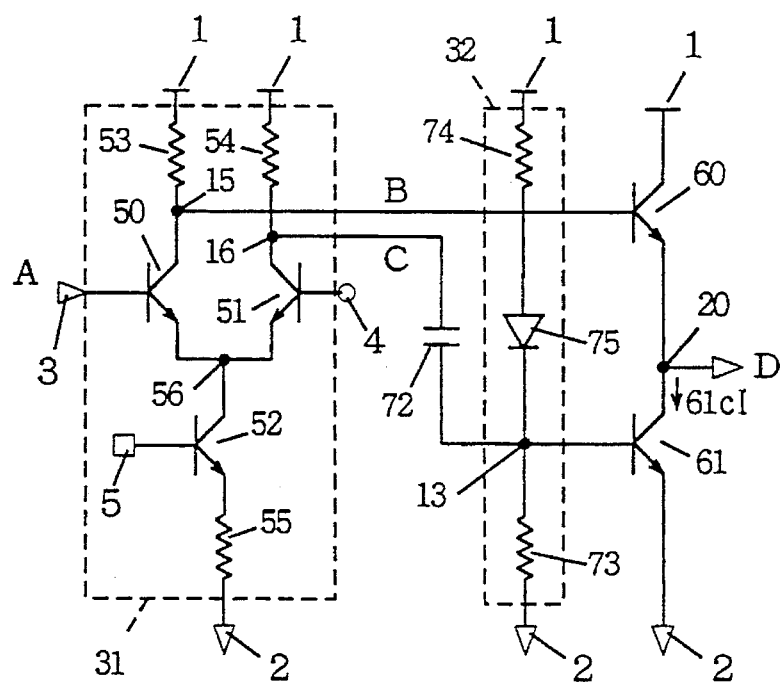
FIG. 12 is a circuit diagram of an ECL circuit in the prior art.
Figure 13:
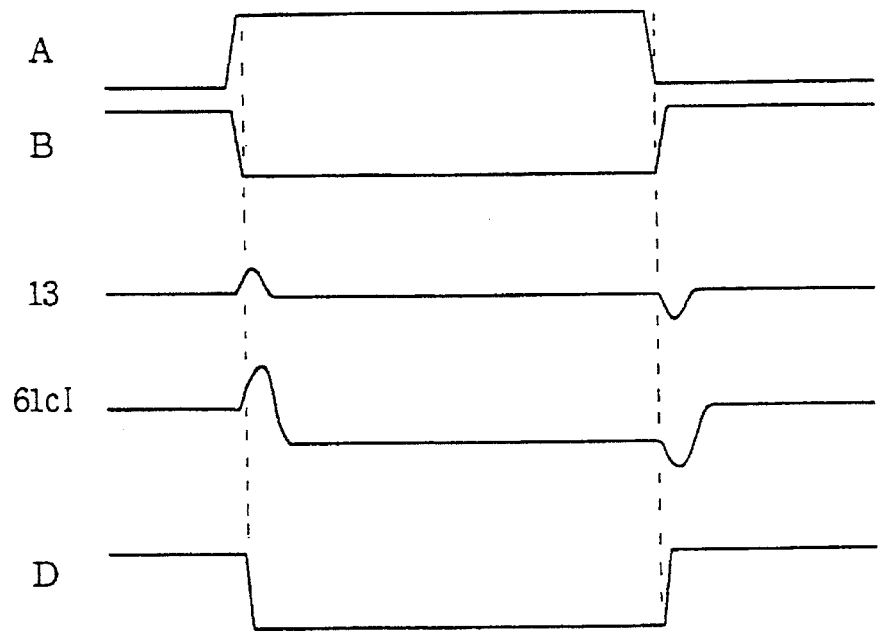
FIG. 13 is a waveform diagram showing operation of an ECL circuit in the prior art.

Referring to FIG. 1, a semiconductor device of a first embodiment includes a switching stage circuit 31 which is connected between VCC supply terminal 1 and VEE supply terminal 2, receives input signal A and VBB signal 4 and outputs switching stage output signal B, emitter-follower transistor 60 which receives switching stage circuit output signal B on its base, and has a collector connected to VCC supply terminal 1 and an emitter connected to output terminal node 20, and pull-down transistor 61 which has a base connected to node 17 and is connected between output terminal node 20 and VEE supply terminal 2. Control capacitor 72 is arranged between node 12 and node 11 located between switching stage circuit 31 and emitter-follower transistor 60. Resistance 73 is connected between node 12 and VEE supply terminal 2. A node 18 is connected to output terminal node 20. The base of pull-down transistor 61 is connected to a node 17. Between nodes 17 and 18, there is arranged a PMOS transistor 70a which is provided for driving the pull-down transistor and receives on its gate the potential of node 12. An NMOS transistor 71 which receives on its gate the potential of node 18 is arranged between node 17 and VEE supply terminal 2. The structure of switching stage circuit 31 is the same as that already described with reference to FIG. 12, and hence will not be described below. In FIGS. 1 and 12, the same portions bear the same reference numbers, and will not be described below.

Figure 2:
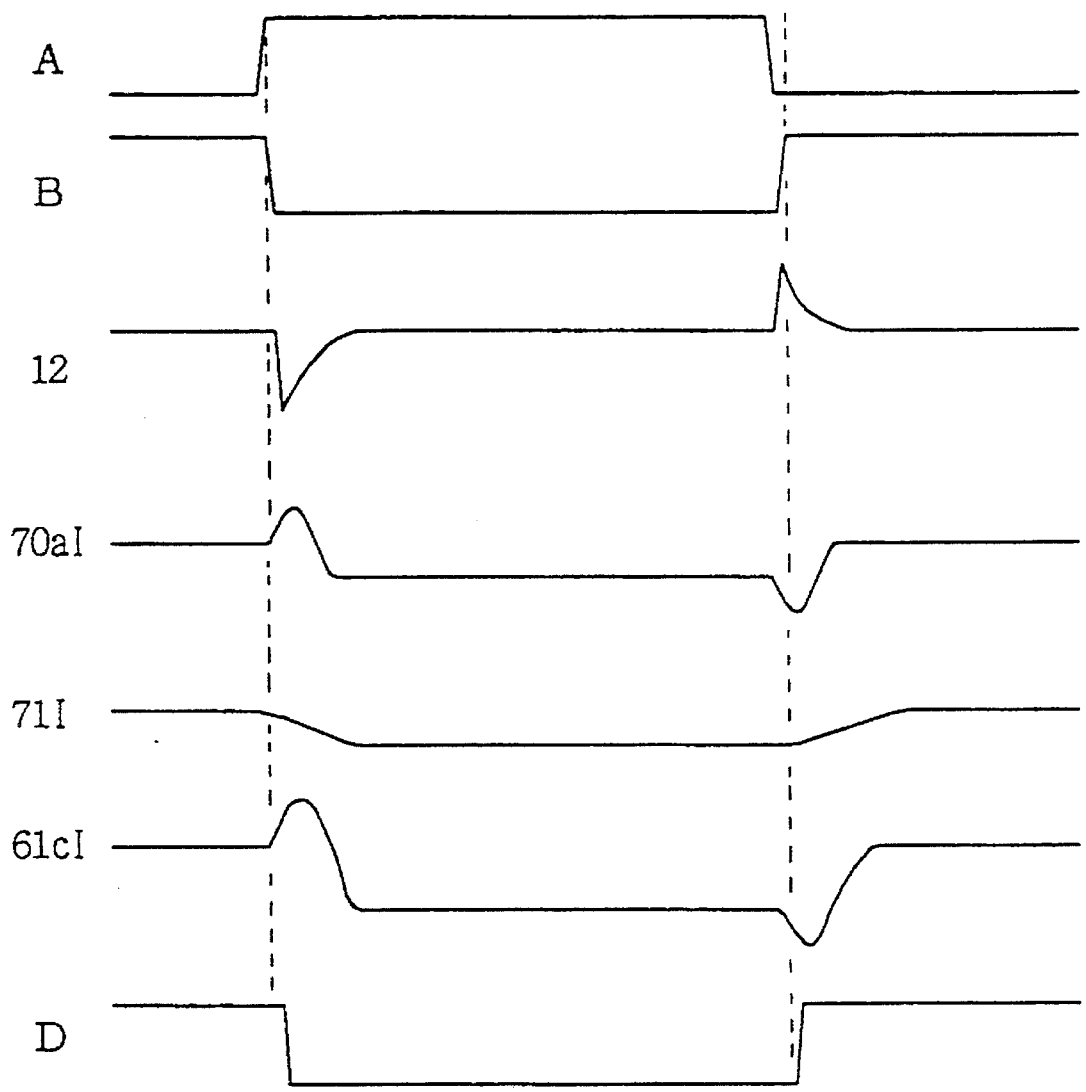
FIG. 2 is a waveform diagram showing operation of the ECL circuit of the first embodiment.

Referring to FIGS. 1 and 2, operation of the circuit shown in FIG. 1 will be described below. When input signal A is "L" (−1.6 V), output signal B of switching stage circuit 31 is "H" (0 V), and output signal D is "H" (−0.8 V). Since a DC current does not flow through control capacitor 72, node 12 is maintained at the potential of VEE by resistance 73. Since the potential of node 12 is a gate signal of PMOS transistor 70a, PMOS transistor 70a is turned on, so that an intended current flows and thus the collector current of pull-down transistor 61 is set to an intended value.

When input signal A changes from "L" (−1.6 V) to "H" (−0.8 V) as shown in FIG. 2, the potential of node 11 receiving output B of switching stage circuit 31 changes from "H" (0 V) to "L" (−0.8 V). Signal B is supplied to the base of emitter-follower transistor 60, and flows through output terminal node 20 to act to lower output signal D. Signal B is also sent to control capacitor 72. The potential of "L" supplied to control capacitor 72 lowers the potential of node 12, and the control capacitor coupling acts to lower the gate voltage of pull-down transistor driving PMOS transistor 70a further below VEE potential. This results in increase of a current 70aI flowing through pull-down transistor driving PMOS transistor 70a, so that the base current of pull-down transistor 61 increases. As a result, a collector current 61cI of pull-down transistor 61 increases to assist the change of the potential of output signal D from "H" to "L". As a result, output signal D can lower rapidly. Since NMOS transistor 71 uses the potential of output terminal node 20 as a gate signal, the current flowing through NMOS transistor 71 decreases and the base current of pull-down transistor 61 increases as output signal D lowers. This also allows rapid change or lowering of output signal D. When a certain time elapses in this state, the potential of node 12 is restored to VEE potential, and the current of pull-down transistor driving PMOS transistor 70a decreases. Since the potential of output signal D has lowered, current 70aI flowing through pull-down transistor driving PMOS transistor 70a decreases slightly below the value which is attained when the output is in the stationary state of "H".

When input signal A changes from "H" (−0.8 V) to "L" (−1.6 V), operation is performed in a manner opposite to the foregoing manner. More specifically, when input signal A changes from "H" to "L", the output potential supplied to output terminal node 20 changes from "L" to "H". At this time, the potential of node 12 is pulled up owing to the control capacitor coupling of control capacitor 72. As a result, the gate potential of pull-down transistor driving PMOS transistor 70a connected to node 12 rises, and current 70aI flowing to transistor 70a decreases. Therefore, the base current of pull-down transistor 61 decreases, and the value of current 61cI flowing through pull-down transistor 61 decreases. At this time, the gate of NMOS transistor 71 is supplied with the potential of output terminal 20 via node 18, so that NMOS transistor 71 increases the current flowing therethrough, and thus the base current of pull-down transistor 61 further decreases, resulting in more rapid or fast rising of the potential of output terminal node 20.

According to the first embodiment, as described above, the current which drives the base of pull-down transistor 61 is supplied from output terminal node 20, so that a bias circuit in the prior art is not employed for flowing a bias current in a DC manner from VCC supply terminal 1 to VEE supply terminal 2. Therefore, current consumption can be reduced. Also in this embodiment, since pull-down transistor driving PMOS transistor 70a controlling the base current is responsive to the potential of switching stage circuit output node 11, the base current of pull-down transistor is controlled in response to the potential at a position which is nearer to the input signal as compared with the prior art. As a result, further rapid response is allowed.

Figure 3:
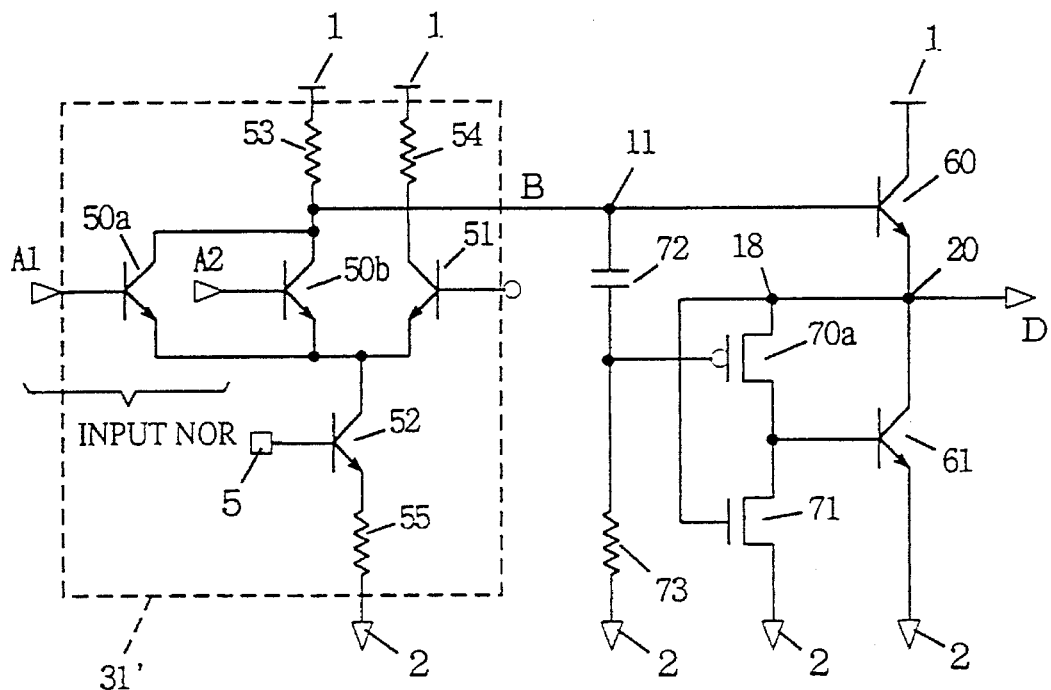
FIG. 3 shows an example of an NOR circuit employing the ECL circuit of the first embodiment.

FIG. 3 shows an NOR circuit to which the first embodiment is applied. As shown in FIG. 3 the invention can be applied to the NOR circuit allowing input of multiple input signals A1, A2, . . . In the NOR circuit, therefore, the effect of the invention described above can be obtained.

(2) Second Embodiment

Figure 4:
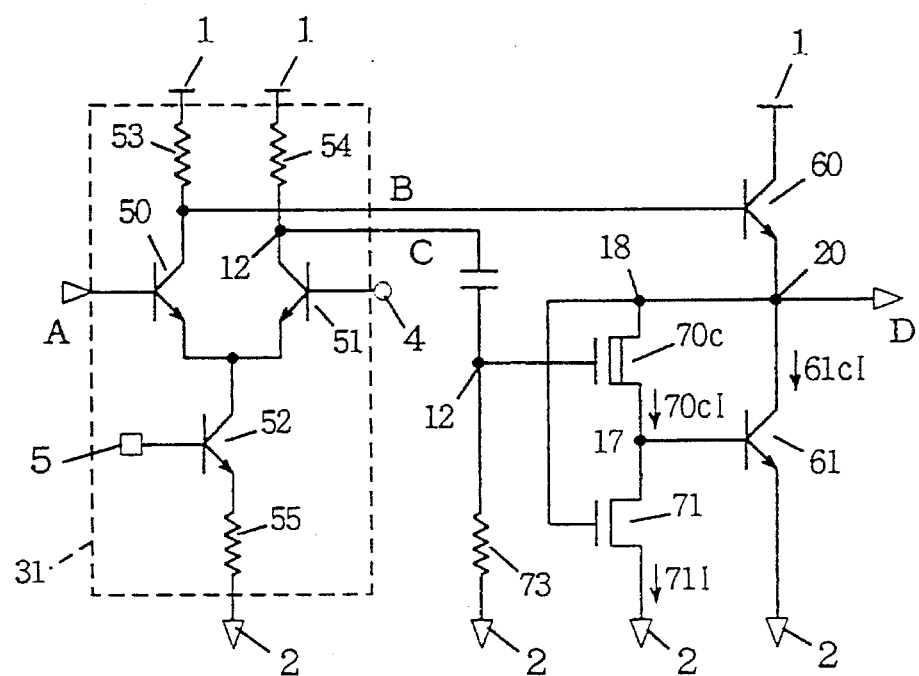
FIG. 4 is a circuit diagram of an ECL circuit of a second embodiment of the invention.

FIG. 4 is a circuit diagram showing a second embodiment of the invention. A basic circuit structure in FIG. 4 is the same as that in FIG. 1, and hence the same portions bear the same reference numbers and will not be described below. The second embodiment differs from the first embodiment in that there is provided an NMOS transistor 70c as an element for driving pull-down transistor 61, and NMOS transistor 70c is supplied on its gate electrode with complementary output signal C of switching stage circuit 31 via control capacitor 72.

Figure 5:
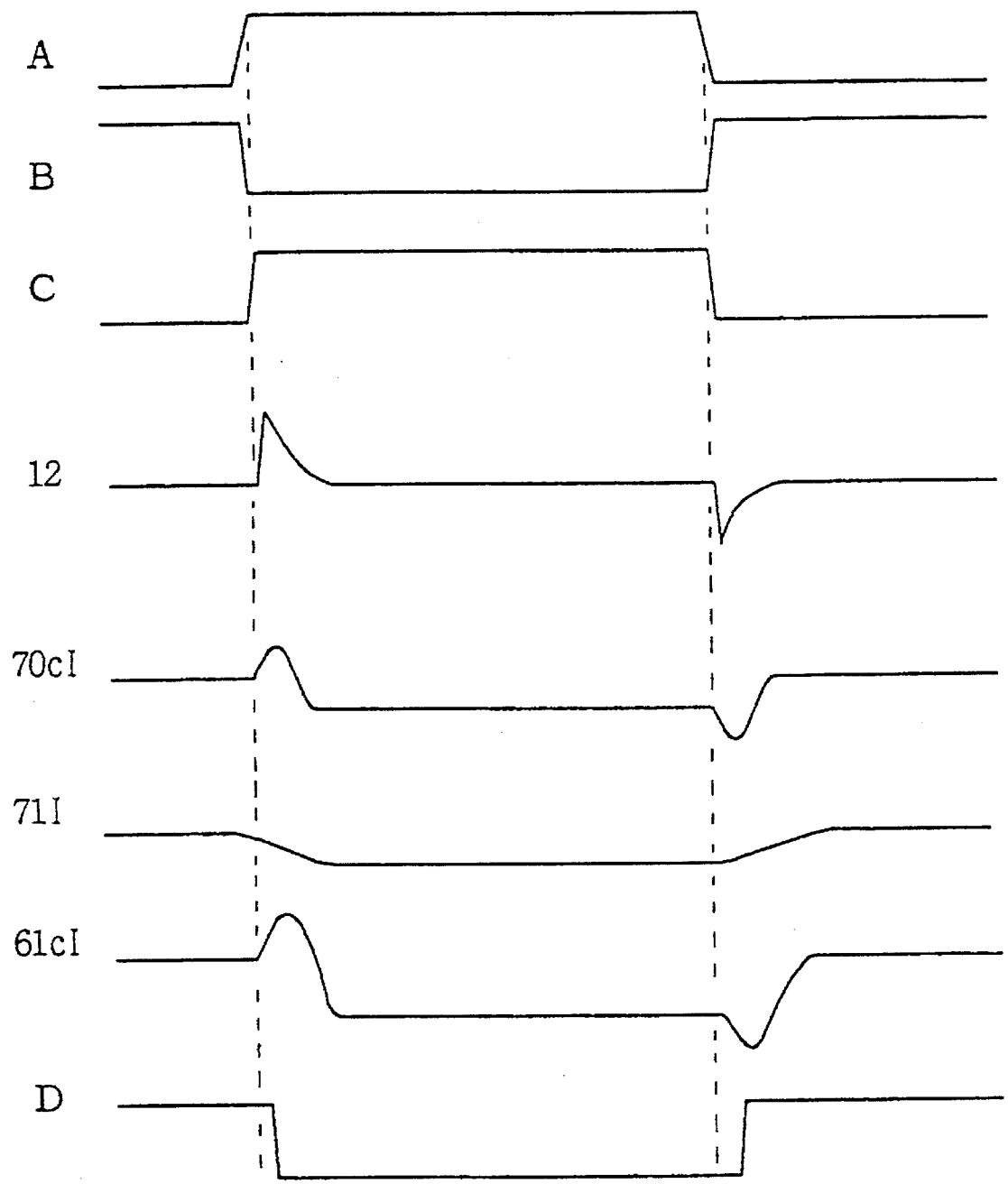
FIG. 5 is a waveform diagram showing operation of the ECL circuit of the second embodiment.

Operation of the second embodiment differs from the first embodiment only in that the NMOS transistor operates instead of the PMOS transistor in the first embodiment and signal C changes oppositely to signal B. Therefore, the operation itself is similar to that of the first embodiment. Accordingly, only waveforms are shown in FIG. 5, and the operation will not be detailed below.

The second embodiment can achieve an effect similar to that of the first embodiment. In contrast to the first embodiment, the second embodiment does not require a PMOS transistor, and all the transistors in the circuit are of the same polarity, i.e., NMOS transistors, so that the effect of the invention can be achieved with a reduced cost.

Regardless of the stationary states of "H" and "L" attained by the potential of output signal D of output terminal node 20, NMOS transistor 70c used in the second embodiment must cause the flow current to ensure the emitter current of emitter-follower transistor 60. For this purpose, NMOS transistor 70c is formed of a depletion type transistor of which threshold voltage $V_{th}$ is adjusted to turn on transistor 70c even when the gate potential in the stationary state, i.e., VEE potential is applied to its gate.

(3) Third Embodiment

Figure 6:
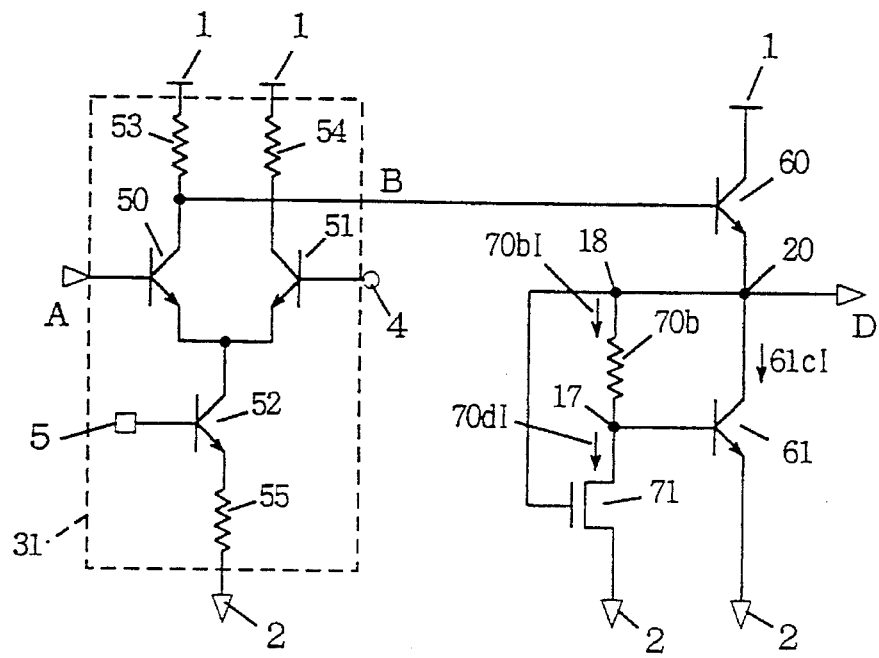
FIG. 6 is a circuit diagram showing an ECL circuit of a third embodiment.
Figure 7:
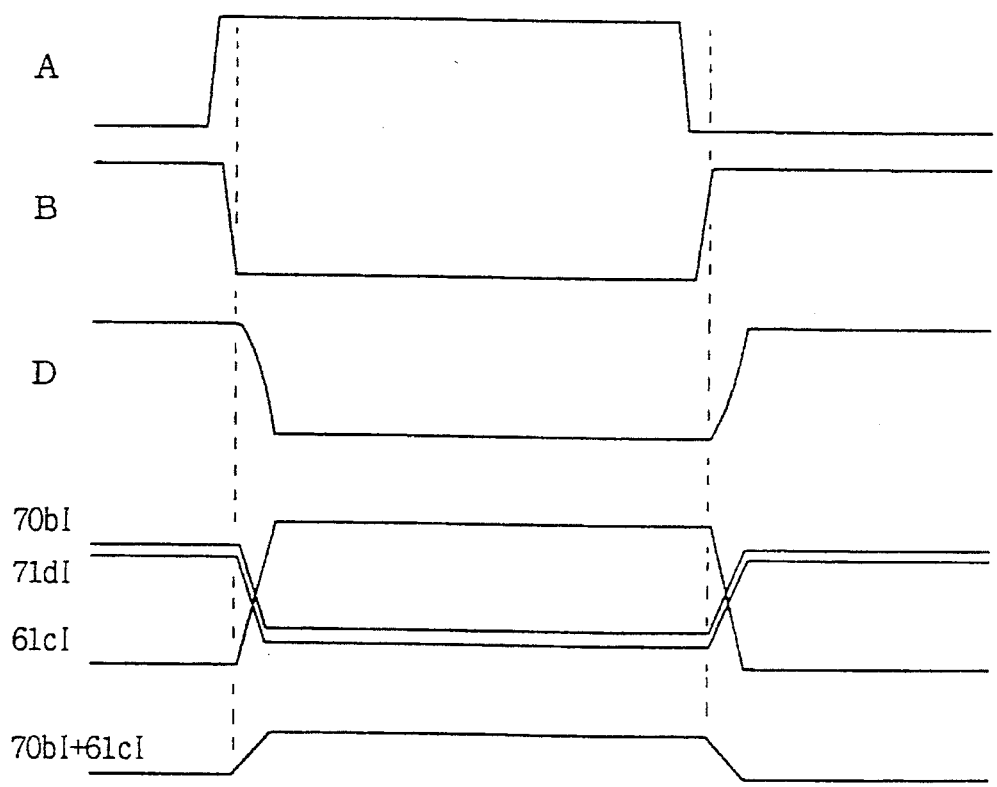
FIG. 7 is a waveform diagram showing operation of the ECL circuit of the third embodiment.

FIG. 6 is a circuit diagram showing a third embodiment of the invention, and FIG. 7 is a waveform diagram showing potentials of nodes and signals in the operation of the circuit in FIG. 6.

Since a basic structure in FIG. 6 is similar to that in FIG. 1, corresponding portions bear the same reference numbers and will not be detailed below, and only a difference will be described below. The third embodiment is provided with a resistance 70b as an element for driving pull-down transistor 61, and is not provided with a control capacitor. Referring to FIG. 6, when the potential of output signal D of output terminal node 20 rises, a drain current 71*d*I flowing through NMOS transistor 71 and a current 70*b*I flowing through resistance 70*b* both increase. However, by setting a resistance value of resistance 70*b* and a size of NMOS transistor 71 to intended values, current 71*d*I of NMOS transistor 71 can be increased by a value larger than an increased value of current 70*b*I flowing through resistance 70*b*. Thereby, it is possible to reduce collector current 61*c*I of pull-down transistor 61 by raising the voltage of output signal D of output terminal node 20, and a sum of collector current 61*c*I and current 70*b*I of resistance 70*b* (i.e., the current pulled out from output terminal node 20) can also be reduced.

Operation of the third embodiment will be described below with reference to FIG. 7. When input signal A changes from "L" to "H", switching stage circuit output B changes from "H" to "L", and output signal D of output terminal node 20 tends to change from "H" to "L". In this case, current values of current 70*b*I of resistance 70*b* and collector current 61*c*I of pull-down transistor 61 increase, so that the output signal D can attain "L" progressively rapidly. At this time, drain current 71*d*I of NMOS transistor 71 and current 70*b*I of resistance 70*b* increase as shown in FIG. 7.

Conversely, when input signal A changes form "H" to "L", 70*b*I, i.e., current value of resistance 70*b* and 61*c*I, i.e., collector current of pull-down transistor 61 likewise decrease, so that output signal D can rise progressively rapidly.

In the third embodiment, since a control capacitor can be eliminated, the layout occupied area can be effectively reduced. Since it is not necessary to drive the pull-down transistor from the switching stage circuit via the control capacitor in contrast to the first and second embodiments, the operation speed of switching stage circuit may be increased. In contrast to the first embodiment, the PMOS transistor is not required, so that the effect of the invention can be reduced with a reduced manufacturing cost.

(4) Fourth Embodiment

Figure 8:
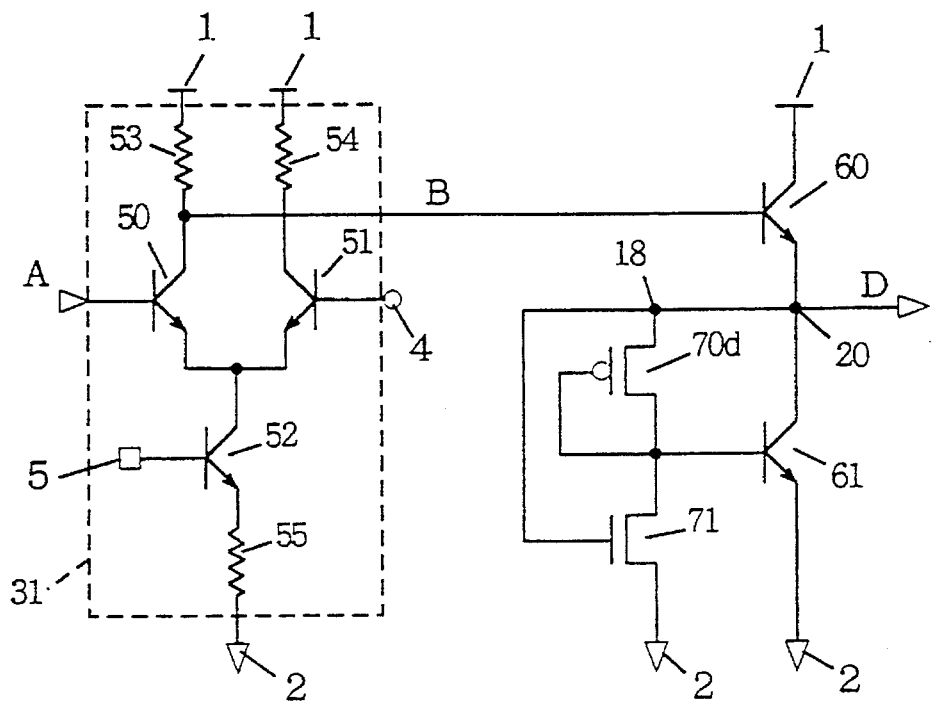
FIG. 8 is a circuit diagram of an ECL circuit of a fourth embodiment.

FIG. 8 is a circuit diagram showing a fourth embodiment of the invention. In the fourth embodiment, the element for driving pull-down transistor 61 is formed of a PMOS transistor 70*d* instead of resistance 71*b* in the third embodiment. Other parts and portions are the same as those in the embodiments already described, and thus they bear the same reference numbers and will not be detailed below.

PMOS transistor 70*d* for driving pull-down transistor 61 in this embodiment is a PMOS transistor of a normally-on type having a gate terminal connected to a drain terminal. The operation of this embodiment is basically similar to that of the third embodiment, and thus will not be described below.

In the fourth embodiment, since the NMOS transistor is provided instead of the resistance in the third embodiment, the layout area can be reduced. Consequently, the layout occupied area can be smaller than that in the third embodiment.

(5) Fifth Embodiment

Figure 9:
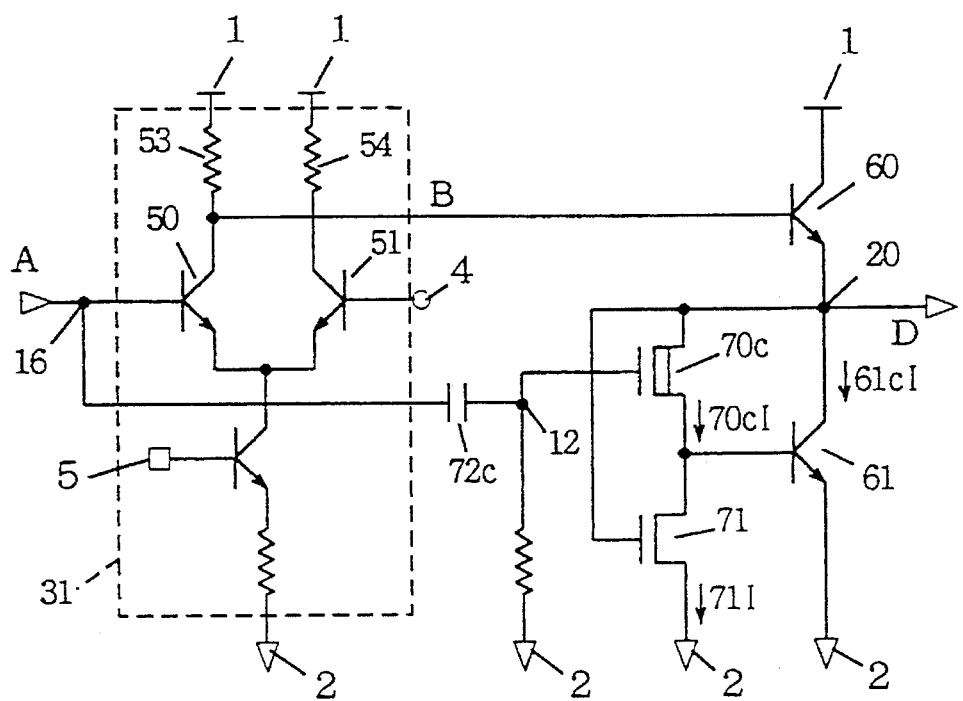
FIG. 9 is a circuit diagram of an ECL circuit of a fifth embodiment.

FIG. 9 is a circuit diagram showing a fifth embodiment. This embodiment is a modification of the second embodiment, and differs from the second embodiment in that control capacitor 72 which is connected to complementary signal C of switching stage circuit 31 in the second embodiment is connected to input signal A itself. More specifically, as shown in FIG. 9, the fifth embodiment is provided with a control transistor 72*c* arranged between node 16, which is formed at the base of npn bipolar transistor 50 forming switching stage circuit 31, and node 12, which is connected to the gate of NMOS transistor 70*c* driving pull-down transistor 61.

Figure 10:
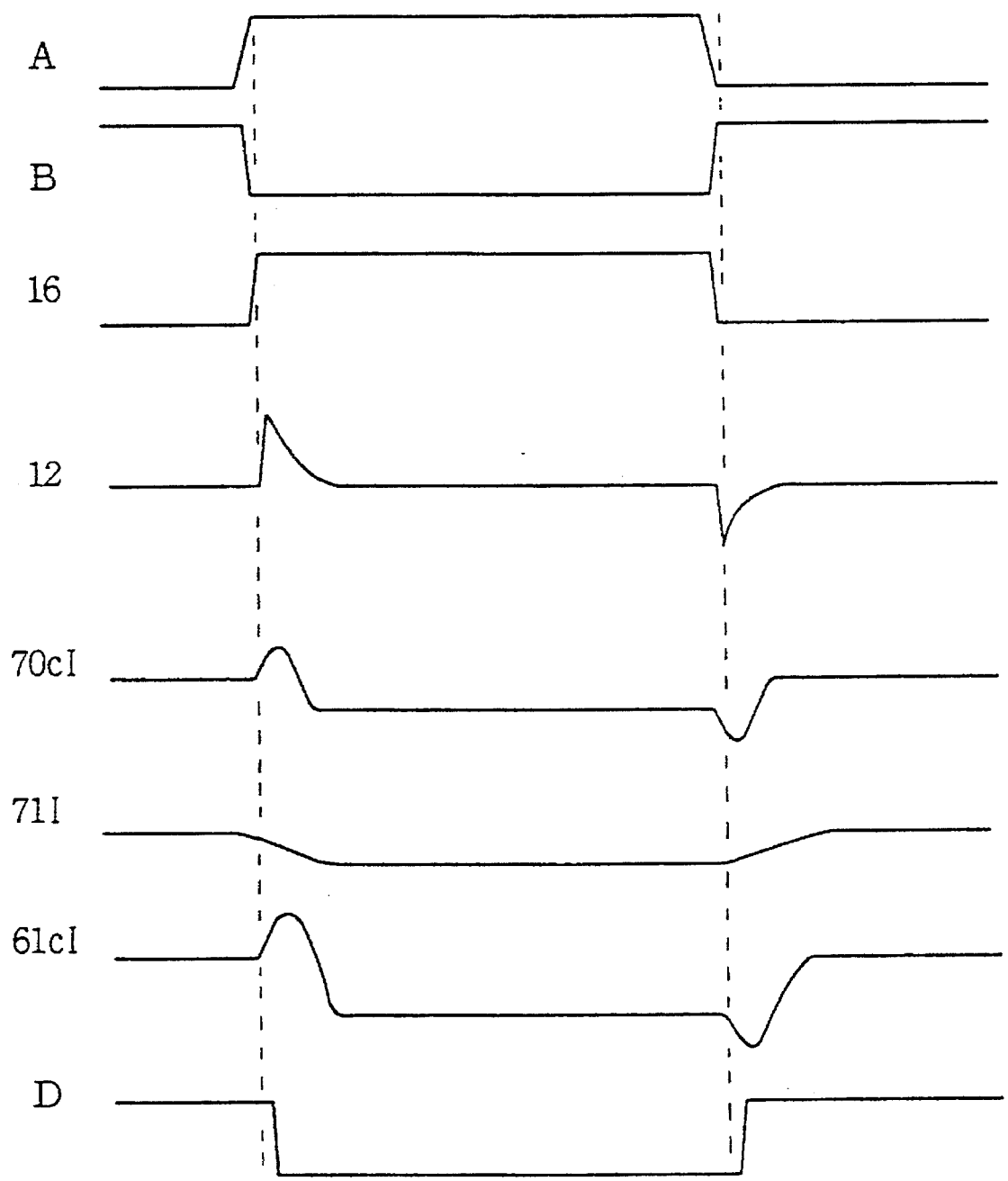
FIG. 10 is a waveform diagram showing operation of the ECL circuit of the fifth embodiment of the invention.

Referring to FIG. 10, operation of the fifth embodiment will be described below with reference to FIG. 10. When input signal A is "L", output B of switching stage circuit 31 is "H", and output signal D supplied from output terminal node 20 is "H". Since a DC current does not flow through control capacitor 72*c*, node 12 is set to VEE potential by resistance 73. Although the potential of node 12 is the gate signal of NMOS transistor 70*c* driving the pull-down transistor, the threshold voltage $V_{th}$ of NMOS transistor 70*c* (depletion type) is adjusted to allow flow of an intended current even in this state.

When input signal A changes from "L" to "H", output B of switching stage circuit 31 changes from "H" to "L". Output signal B of switching stage circuit 31 is supplied to emitter-follower transistor 60 and serves to lower output signal D of output terminal node 20. At this time, node 12 is pulled up to VEE potential by the control capacitor coupling of control capacitor 72 in response to the rise of input signal A. As a result, the potential is applied to the gate of NMOS transistor 70 driving the pull-down transistor to turn on NMOS transistor 70, so that the base current of pull-down transistor 61 increases, and thus output signal D lowers more rapidly. Since the potential of output terminal node 20 of NMOS transistor 71 forms the gate signal, the current flowing through NMOS transistor 71 decreases as the above potential lowers, so that the base current of pull-down transistor 61 increases, and thus lowering is performed further rapidly.

When input signal A changes from "H" to "L", the operation is performed in the manner completely opposite to the above, and the output signal D rises rapidly as is done in the foregoing embodiments.

In this embodiment, since the operation of the NMOS transistor driving pull-down transistor 61 is performed in response to the input signal, which is different from the second embodiment, the responsibility is further improved as compared with the second embodiment. Further, the PMOS transistor is not used, so that the effect of the invention can be achieved with a reduced manufacturing cost.

In this embodiment, since the input side of the switching stage circuit 31 is connected to control capacitor 72*c*, this embodiment cannot be applied to structures such as an NOR circuit and can be applied only to one-input logic, which is different from the foregoing embodiments.

(6) Sixth Embodiment

Figure 11:
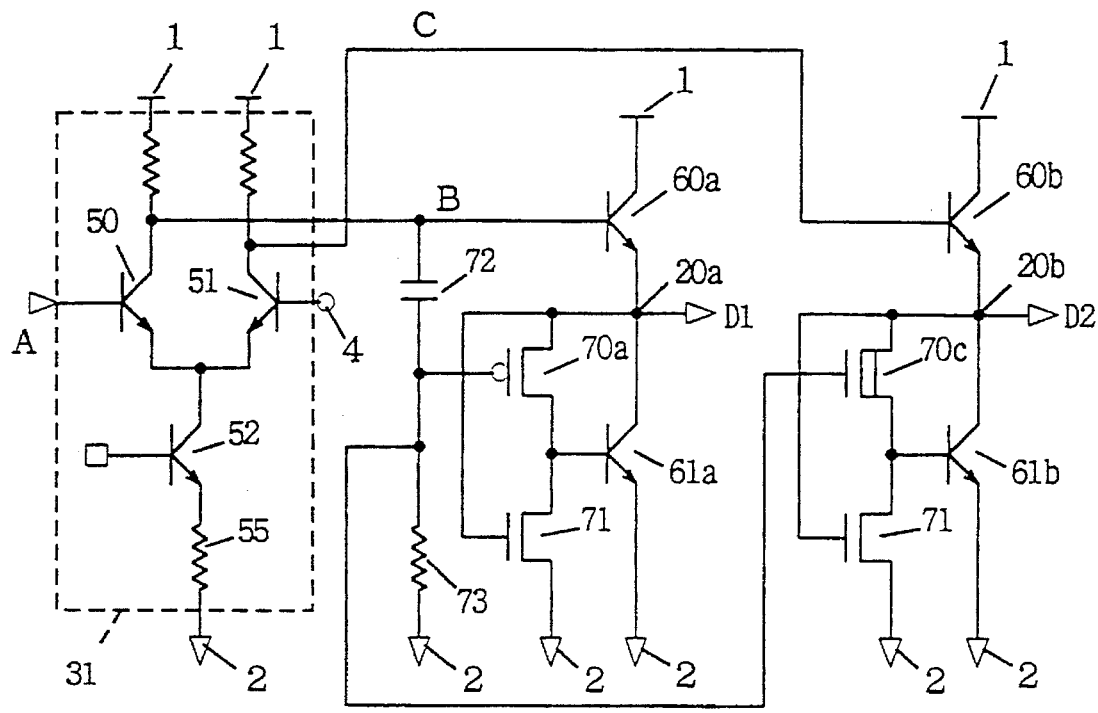
FIG. 11 is a circuit diagram of an ECL circuit of a sixth embodiment.
Figure 14:
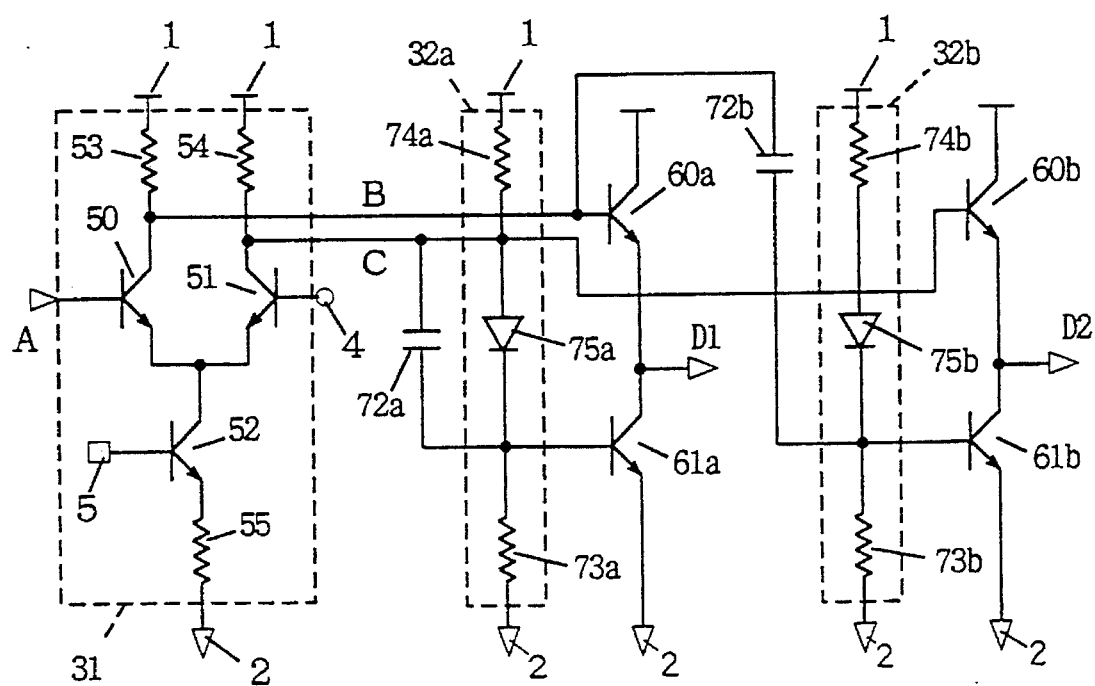
FIG. 14 is a circuit diagram of an ECL circuit for obtaining differential outputs.

FIG. 11 is a circuit diagram showing a sixth embodiment of the invention, and particularly showing a structure, in which the first embodiment shown in FIG. 1 and the second embodiment shown in FIG. 4 are connected to collectors of npn bipolar transistor 50 at the input signal side and npn bipolar transistor 51 receiving VBB signal on its base, respectively. This figure corresponds to FIG. 14 showing the prior art, and shows an example to which the invention is applied for obtaining differential outputs. According to the embodiment of the invention, although two outputs D1 and D2 are output from output terminal nodes 20*a* and 20*b*, respectively, the control capacitor is arranged only at the side from which one of output signals (i.e., signal D1) is output, as shown in FIG. 11.

Referring to FIG. 11, the sixth embodiment requires only one control capacitor 72 and only one resistance 73 for obtaining the differential outputs. Therefore, the layout area and power consumption can be improved. In this embodiment, in order to achieve the equal delay times of differential output signals D1 and D2, PMOS transistor 70a and NMCS transistor 70c must have completely complementary characteristics. For this purpose, threshold voltage $V_{th}$ of NMOS transistor 70c is set to an appropriate value.

Although the embodiments have been described in connection with the inverter circuit of which input signal A and output signal D have opposite characteristics, the invention is not restricted to this, and can be applied to a NOR circuit and others as shown in FIG. 3, except for the fifth embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a first bipolar transistor having first and second electrodes connected to first and second potentials, respectively, and a control electrode receiving an input signal;
    a second bipolar transistor having first and second electrodes connected to said first and second potentials, respectively, and a control electrode receiving a reference signal;
    a third bipolar transistor having a control electrode connected to said first electrode of said first bipolar transistor, a first electrode connected to said first potential and a second electrode connected to an output terminal node;
    a fourth bipolar transistor connected between said output terminal node and said second potential for accelerating change of the potential of said output terminal node; and
    adjusting means connected between a control electrode of said fourth bipolar transistor and said second potential for adjusting a current flowing into the control electrode of said fourth bipolar transistor in response to potential change of said output terminal node.

2. The semiconductor device according to claim 1, further comprising biasing means connected between said output terminal node and the control electrode of said fourth bipolar transistor for biasing the current of the control electrode of said fourth bipolar transistor to an intended state in response to a potential at the same side as the input signal with respect to at least the control electrode of said third bipolar transistor.

3. The semiconductor device according to claim 2, wherein said potential at the same side as the input signal with respect to the control electrode of said third bipolar transistor includes the potential at the side of said first electrode of said first or second bipolar transistor.

4. The semiconductor device according to claim 2, wherein said potential at the same side as the input signal with respect to the control electrode of said third bipolar transistor is the potential of the control electrode of said first bipolar transistor.

5. The semiconductor device according to claim 3, wherein said biasing means includes an MOS transistor having said control electrode connected to the side of the first electrode of said first or second bipolar transistor via a capacitor.

6. The semiconductor device according to claim 1, further comprising means connected to said output terminal node and the control electrode of said fourth bipolar transistor for generating a potential difference between them.

7. The semiconductor device according to claim 6, wherein said means for generating the potential difference includes a field-effect transistor.

8. The semiconductor device according to claim 6, wherein said means for generating the potential difference includes a resistance.

9. The semiconductor device according to claim 1, wherein a plurality of said first bipolar transistors are provided, and mutually different input signals are supplied to the control electrodes of said plurality of first bipolar transistors, respectively.

10. The semiconductor device according to claim 9, wherein said semiconductor device forms a logic circuit.

11. A semiconductor device comprising:
    a first bipolar transistor having first and second electrodes connected to first and second potentials, respectively, and receiving on its control signal an input signal;
    a second bipolar transistor having first and second electrodes connected to said first and second potentials, respectively, and receiving on its control electrode a reference potential;
    a capacitor for taking out a potential from one of said first electrodes of said first and second bipolar transistors;
    a third bipolar transistor having a control electrode connected to said first electrode of said first bipolar transistor, a first electrode connected to said first potential and a second electrode connected to a first output terminal node;
    a fourth bipolar transistor connected between said first output terminal node and said second potential for accelerating the change of the potential of said first output terminal node in a first direction;
    first adjusting means connected between said first output terminal node and the control electrode of said fourth bipolar transistor for adjusting a current flowing into the control electrode of said fourth bipolar transistor in response to the potential of said capacitor;
    a fifth bipolar transistor having a control electrode connected to said first electrode of said second bipolar transistor, a first electrode connected to said first potential and a second electrode connected to a second output terminal;
    a sixth bipolar transistor connected between said second output terminal node and said second potential for accelerating the change of the potential of said second output terminal node in a second direction different from said first direction; and
    second adjusting means connected between said second output terminal node and a control electrode of said sixth bipolar transistor for adjusting a current flowing into the control electrode of said sixth polar transistor in response to the potential of said capacitor.

12. The semiconductor device according to claim 11, wherein
    said first and second output terminal nodes output mutually complementary signals,
    said first adjusting means includes a field-effect transistor of a first conductivity type,
    said second adjusting means includes a field-effect transistor of a second conductivity type, and
    said first and second field-effect transistors have threshold voltages adjusted to achieve mutually complementary characteristics.

13. The semiconductor device according to claim 12, further comprising means for adjusting the potential of the control electrode of said fourth bipolar transistor in response to the potential of said first output terminal node.

14. The semiconductor device according to claim 12, further comprising means for adjusting the potential of the control electrode of said sixth bipolar transistor in response to the potential of said second output terminal node.

15. The semiconductor device according to claim 11, wherein said first adjusting means adjusts current flowing into the control electrode of said fourth bipolar transistor in response also to potential change of said first output terminal node and said second adjusting means adjusts current flowing into the control electrode of said fourth bipolar transistor in response also to potential change of said second output terminal node.

\* \* \* \* \*